United States Patent
Gaessler et al.

(10) Patent No.: US 7,084,637 B2
(45) Date of Patent: Aug. 1, 2006

(54) METHOD FOR MONITORING AT LEAST TWO ELECTROMAGNETIC VALVES OF AN INTERNAL COMBUSTION ENGINE, ESPECIALLY AN INTERNAL COMBUSTION ENGINE OF A MOTOR VEHICLE IN PARTICULAR

(75) Inventors: Hermann Gaessler, Vaihingen (DE); Ulf Pischke, Stuttgart (DE); Hubert Schweiggart, Stuttgart (DE); Rolf Jaros, Backnang (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/511,970

(22) PCT Filed: Jun. 18, 2003

(86) PCT No.: PCT/DE03/02041

§ 371 (c)(1),
(2), (4) Date: Oct. 20, 2004

(87) PCT Pub. No.: WO2004/017080

PCT Pub. Date: Feb. 26, 2004

(65) Prior Publication Data

US 2005/0131624 A1 Jun. 16, 2005

(30) Foreign Application Priority Data

Jul. 26, 2002 (DE) .................. 102 34 091

(51) Int. Cl.
*F02P 17/00* (2006.01)
*G01M 15/04* (2006.01)

(52) U.S. Cl. .................. 324/381; 327/378; 701/114

(58) Field of Classification Search .................. 324/381, 324/380, 378, 388, 503, 522, 525, 73.1; 701/114; 123/479, 490, 90.11; 73/116, 119 R; 361/152, 361/154
See application file for complete search history.

(56) References Cited

U.S. PATENT DOCUMENTS 4,180,026 A * 12/1979 Schulzke et al. ........... 123/490

(Continued)

FOREIGN PATENT DOCUMENTS

DE 43 28 719 3/1995

(Continued)

*Primary Examiner*—Vincent Q. Nguyen
*Assistant Examiner*—Hoai-An D. Nguyen
(74) *Attorney, Agent, or Firm*—Kenyon & Kenyon LLP

(57) ABSTRACT

A device for monitoring at least two electromagnetic valves of an internal combustion engine in a motor vehicle. An actual current that is independent of the other valves may be supplied to each valve. A setpoint current is preselected for each valve. Measuring devices are provided for measuring the actual currents supplied to the valves. A control unit is used to add the measured actual currents to yield a total actual current. Due to the control unit, the setpoint currents are added to yield a total setpoint current and compared to the total actual current. This comparison is used by the control unit for monitoring the valves and/or their interconnections.

9 Claims, 5 Drawing Sheets

U.S. PATENT DOCUMENTS

| | | | |
|---|---|---|---|
| 4,381,748 A * | 5/1983 | Eckert et al. | 123/406.28 |
| 4,764,729 A * | 8/1988 | Yakuwa et al. | 324/546 |
| 6,188,224 B1 | 2/2001 | Hannoyer et al. | |
| 6,227,062 B1 * | 5/2001 | Doman | 74/335 |
| 6,505,113 B1 * | 1/2003 | Eichenseher et al. | 701/114 |
| 6,640,756 B1 * | 11/2003 | Ogiso | 123/90.11 |
| 6,675,787 B1 * | 1/2004 | Damitz et al. | 123/673 |
| 6,874,709 B1 * | 4/2005 | Ricco | 239/585.1 |
| 2003/0150429 A1 * | 8/2003 | Rueger | 123/490 |

FOREIGN PATENT DOCUMENTS

| | | |
|---|---|---|
| DE | 197 04 166 | 8/1997 |
| EP | 1 103 817 | 5/2001 |

* cited by examiner

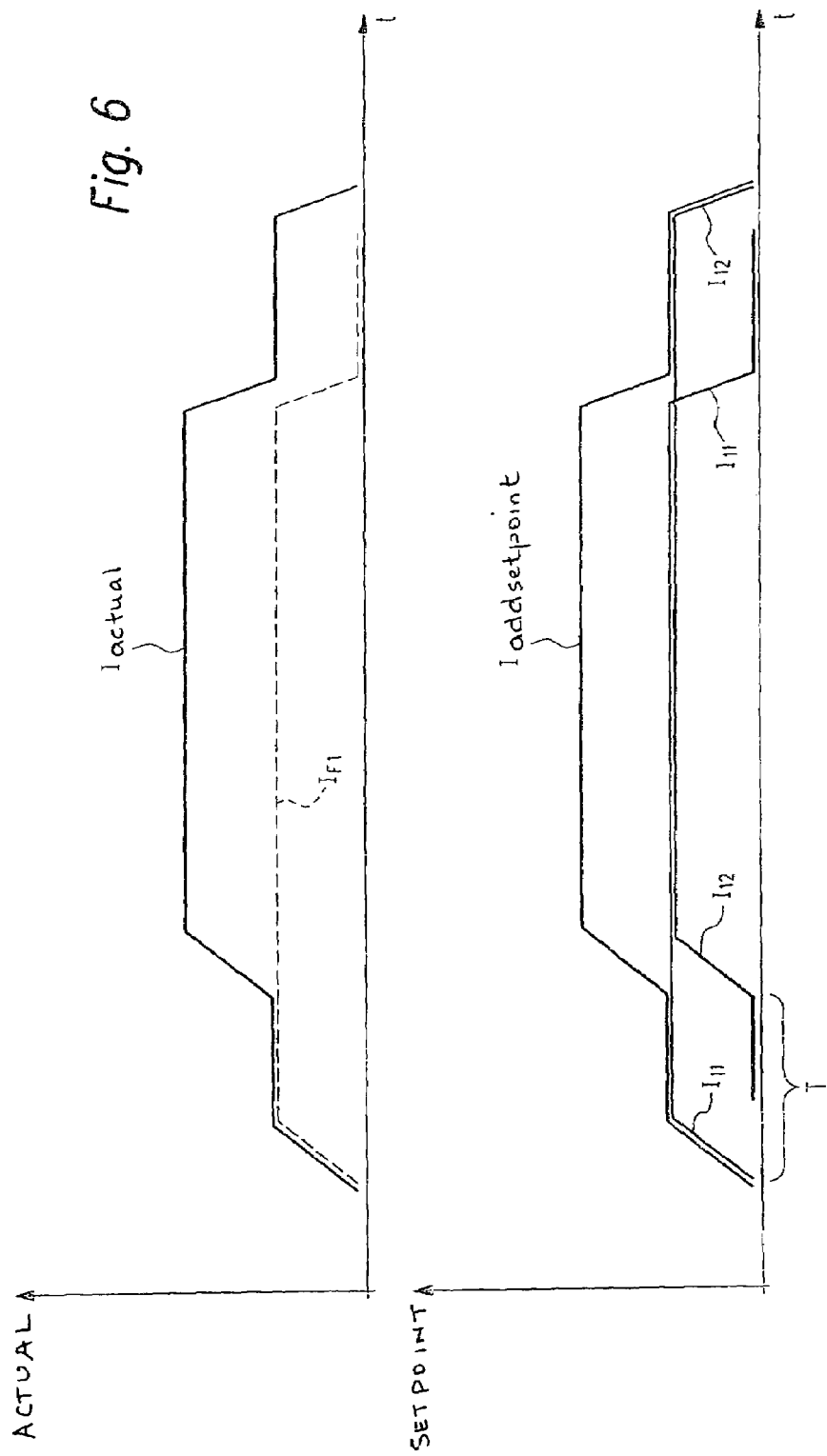

METHOD FOR MONITORING AT LEAST TWO ELECTROMAGNETIC VALVES OF AN INTERNAL COMBUSTION ENGINE, ESPECIALLY AN INTERNAL COMBUSTION ENGINE OF A MOTOR VEHICLE IN PARTICULAR

FIELD OF THE INVENTION

The present invention is directed to a method for monitoring at least two electromagnetic valves of an internal combustion engine in a motor vehicle in particular, an actual current being supplied to each valve independently of the other valves, and a setpoint current being defined for each valve. The present invention also relates to a corresponding device for monitoring at least two electromagnetic valves. The present invention also relates to all applications in which the valves mentioned above are replaced by any other electric consumers of the internal combustion engine.

BACKGROUND INFORMATION

German patent document no. 43 28 719 discusses the detection and analysis of the current flowing through an electric consumer. A fault in the consumer is detectable by comparison with predetermined setpoint values.

If such a device is to be used with a plurality of consumers, a corresponding plurality of individual analyses is required. This may entail significant expenditure.

SUMMARY OF THE INVENTION

An object of the exemplary embodiment and/or exemplary method of the present invention is to create a method of the type defined at the outset that requires only minor expenditure even for a large number of valves.

In a method of the type described herein, this object may be achieved according to the exemplary embodiment and/or exemplary method of the present invention by determining a total actual current supplied to the valves, by adding the setpoint currents to yield a total setpoint current, by comparing the total setpoint current to the total actual current, and by using the result of the comparison to monitor the valves and/or their interconnection.

Thus the analysis is no longer performed individually for each consumer, as is the case in the related art, but instead all the valves are analyzed together. This is done by determining the total actual current and adding the setpoint currents together to yield the total setpoint current. These total currents are then compared according to the exemplary embodiment and/or exemplary method of the present invention. This results in the significant advantage of an extensive simplification of the entire method and greatly reduced monitoring complexity.

Essentially all the current supplied to a certain valve may be included in the monitoring. This permits particularly accurate and thus reliable monitoring.

In a first advantageous exemplary embodiment of the present invention, the actual currents supplied to the valves are measured by at least two measuring devices and added to yield the total actual current. Thus the actual currents measured by the two measuring devices are added up here.

In a second advantageous exemplary embodiment of the present invention, the actual currents supplied to the valves are measured by a single measuring device and used further as the total actual current. In this case, there is only one measuring device that measures the total actual current directly. It is apparent that this results in less expenditure for components and also omits the addition of measured actual currents.

It is particularly advantageous if a holding current with which the particular valve is held in an end position in a stable manner is used as the actual current. This further simplifies the entire monitoring procedure without any significant loss of accuracy.

It is also advantageous if a quenching current is used as the actual current, this quenching current resulting from the electric energy remaining in the valve after shutdown of the holding current. The quenching current is thus a feedback current, so that there is also monitoring in this regard.

In an advantageous further refinement of the exemplary embodiment and/or exemplary method of the present invention, chronological successive measurements and comparisons are used to detect a faulty valve from the point in time of occurrence of the difference. Thus, with the exemplary method according to the present invention not only may a fault be detected as such but it may also be deduced that the valve is faulty.

In addition, the present invention is implemented by a computer program having program commands suitable for execution of the exemplary method according to the present invention when the computer program is running on a computer. The same thing is also true of a digital memory medium with a computer program having program commands suitable for executing the exemplary method according to the present invention.

Other features, applications, and advantages of the exemplary embodiment and/or exemplary method of the present invention are derived from the following description of exemplary embodiments and methods of the present invention, which are depicted in the drawings and/or otherwise described herein.

BRIEF DESCRIPTION OF THE DRAWINGS

FIG. 6 shows two schematic time charts of currents over two electromagnetic valves from FIG. 5.

DETAILED DESCRIPTION

Figure 1:
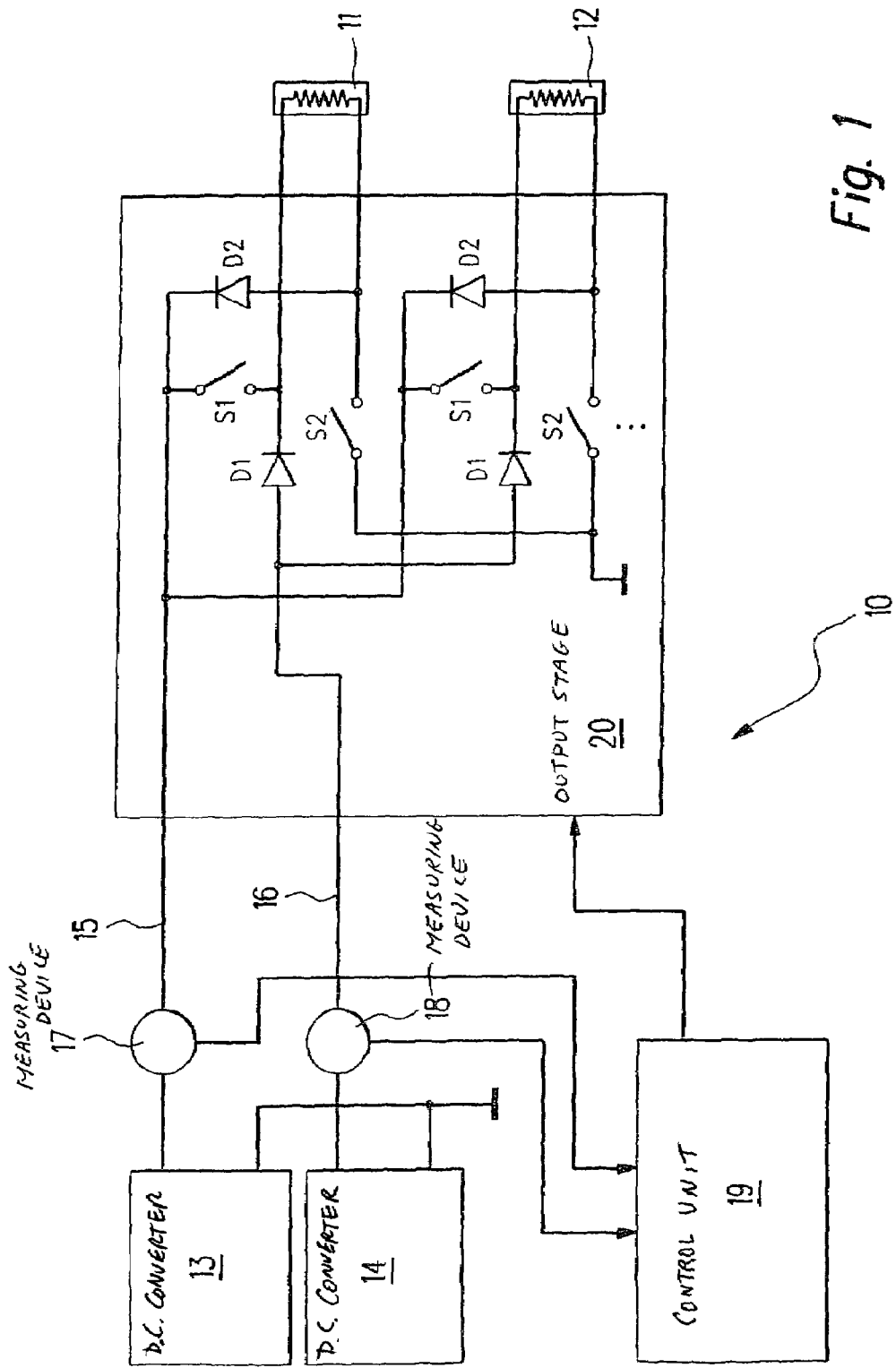
FIG. 1 shows a schematic block diagram of a first exemplary embodiment of a device according to the present invention for monitoring at least two electromagnetic valves of an internal combustion engine.

FIG. 1 shows a device 10 for monitoring at least two electromagnetic valves 11, 12. Electromagnetic valves 11, 12 are provided for use in an internal combustion engine in a motor vehicle in particular.

It is pointed out explicitly that instead of valves 11, 12, the following description may also apply to any other electric consumers of the internal combustion engine. In addition, it is pointed out that the following description may be applied not only to two valves 11, 12 shown here, but device 10 may also be used for any plurality of valves, i.e., consumers, through appropriate expansions.

Two d.c. converters 13, 14 are provided for supplying power to valves 11, 12. D.c. converter 13 is suitable for generating a booster current on an electric line 15. Accordingly, d.c. converter 14 is suitable for generating a holding current on an electric line 16. The booster current is greater than the holding current.

A measuring device for measuring the booster current and another for the holding current are interconnected in lines 15, 16. The actual currents measured by measuring devices 17, 18 are sent to a control unit 19.

An output stage 20, via which the current flow through valves 11, 12 is controlled, is provided between meters 17, 18 and valves 11, 12. This control is provided via control unit 19. The function of output stage 20, its control, and the current flow generated by it over valve 11 are explained in greater detail below with reference to FIG. 2. The explanation given there also pertains accordingly to the current flow through valve 12 and the current flow through any additional valve.

Figure 2:
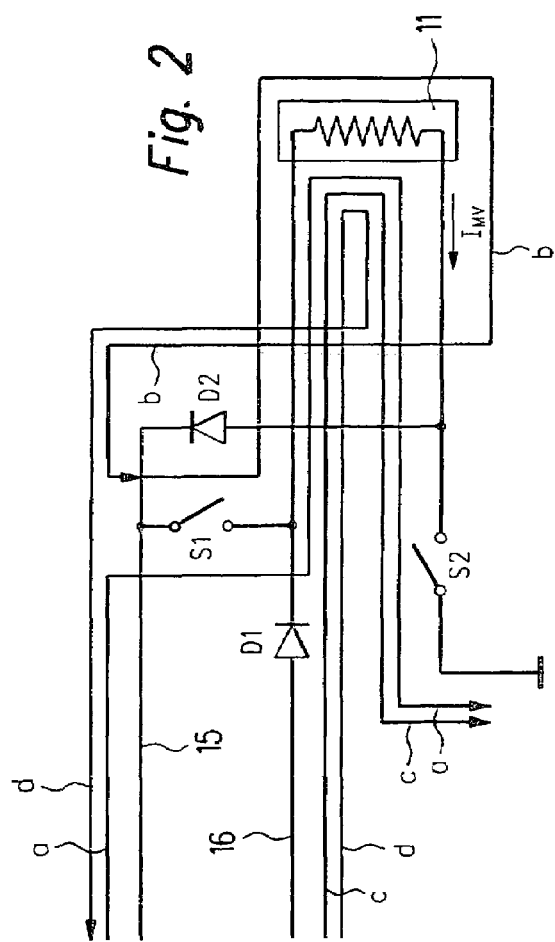
FIG. 2 shows a schematic wiring diagram for one of the electromagnetic valves of FIG. 1, showing the current flow in four successive time ranges.

FIG. 2 shows lines 15, 16 coming from two d.c. converters 13, 14. Line 16 is connected via a diode D1, which is connected in the flow direction, to one of the two terminals of electromagnetic valve 11. The other terminal of electromagnetic valve 11 is connected via a diode D2, which is also connected in the flow direction, to line 15. The cathodes of both diodes D1, D2 are interconnected via switch S1. The anode of diode D2 is connected to ground across a switch S2.

Depending on the switch positions of two switches S1, S2, there is a different current flow across valve 11. Four different switch positions resulting in four different current flows in four successive time ranges a, b, c, d may be set using two switches S1, S2. The positions of two switches S1, S2 are controlled by control unit 19 as already mentioned.

Figure 3:
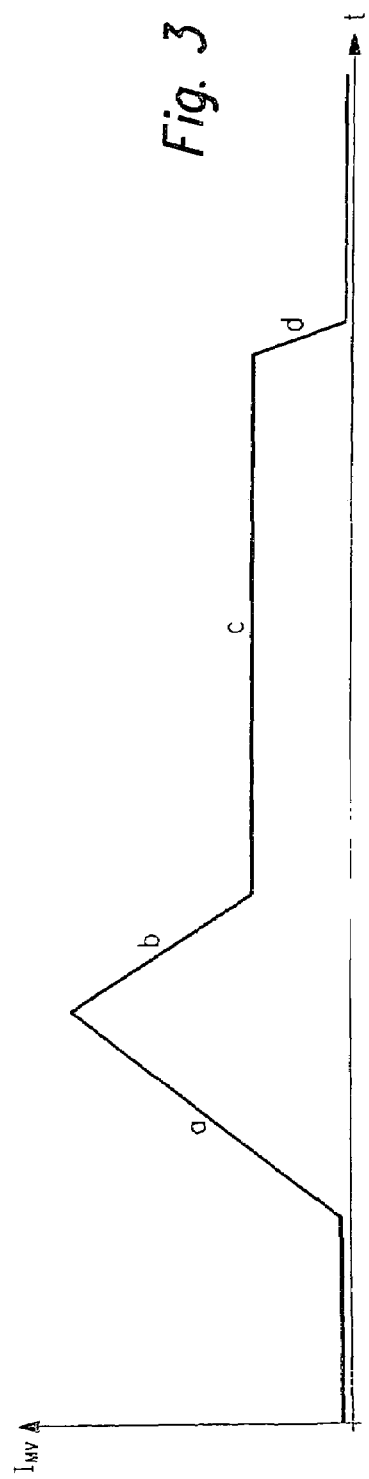
FIG. 3 shows a schematic time chart of the current across one of the electromagnetic valves of FIG. 1 in the four time ranges.

FIG. 3 shows current $I_{MV}$ across electromagnetic valve 11 as a function of time. In particular, four time ranges a, b, c, d resulting from the four adjustable switch settings of two switches S1, S2 are shown in FIG. 3.

In first time range a, both switches S1, S2 are closed. This yields a current flow a, as depicted in FIG. 2 and designated accordingly as "a." The booster current generated by d.c. converter 13 flows across valve 11. This current $I_{MV}$ increases up to a final value.

In second time range b, which follows time range a, switch S1 is closed and switch S2 is opened. This yields a current flow as depicted in FIG. 2 and designated accordingly as "b." This current flow is referred to as a free-running state. This means that at least a portion of the electric energy contained in electromagnetic valve 11 is dissipated via this free-running state. Accordingly, current $I_{MV}$ declines in time range b according to FIG. 3.

Switch S1 is opened in time range c and switch S2 is closed. This yields a current flow like that depicted in FIG. 2, where it is designated accordingly as "c." The holding current generated by d.c. converter 14 in time range c is sent to valve 11. This holding current is selected so that the end position reached by valve 11 on the basis of the booster current does not change.

Both switches S1, S2 are open in time range d which follows time range c. This yields a current flow like that depicted in FIG. 2 and designated accordingly as "d." This current flow constitutes quenching of electromagnetic valve 11. This means that the energy contained in electromagnetic valve 11 is completely dissipated to 0. Current $I_{MV}$ then issuing from valve 11 flows across diode D2 to d.c. converter 13 in time range d. Thus a feedback current flows, this current being measurable by measuring device 17 in the same way as the booster current flowing in the direction toward valve 11.

As mentioned previously, the actual current flowing to valves 11, 12 is measured by measuring devices 17, 18, and the measurement result is sent to control unit 19. Control unit 19 adds the currents measured by measuring devices 17, 18 to yield a total actual current $I_{addactual}$. This is depicted in the top time chart in FIG. 4.

Figure 4:
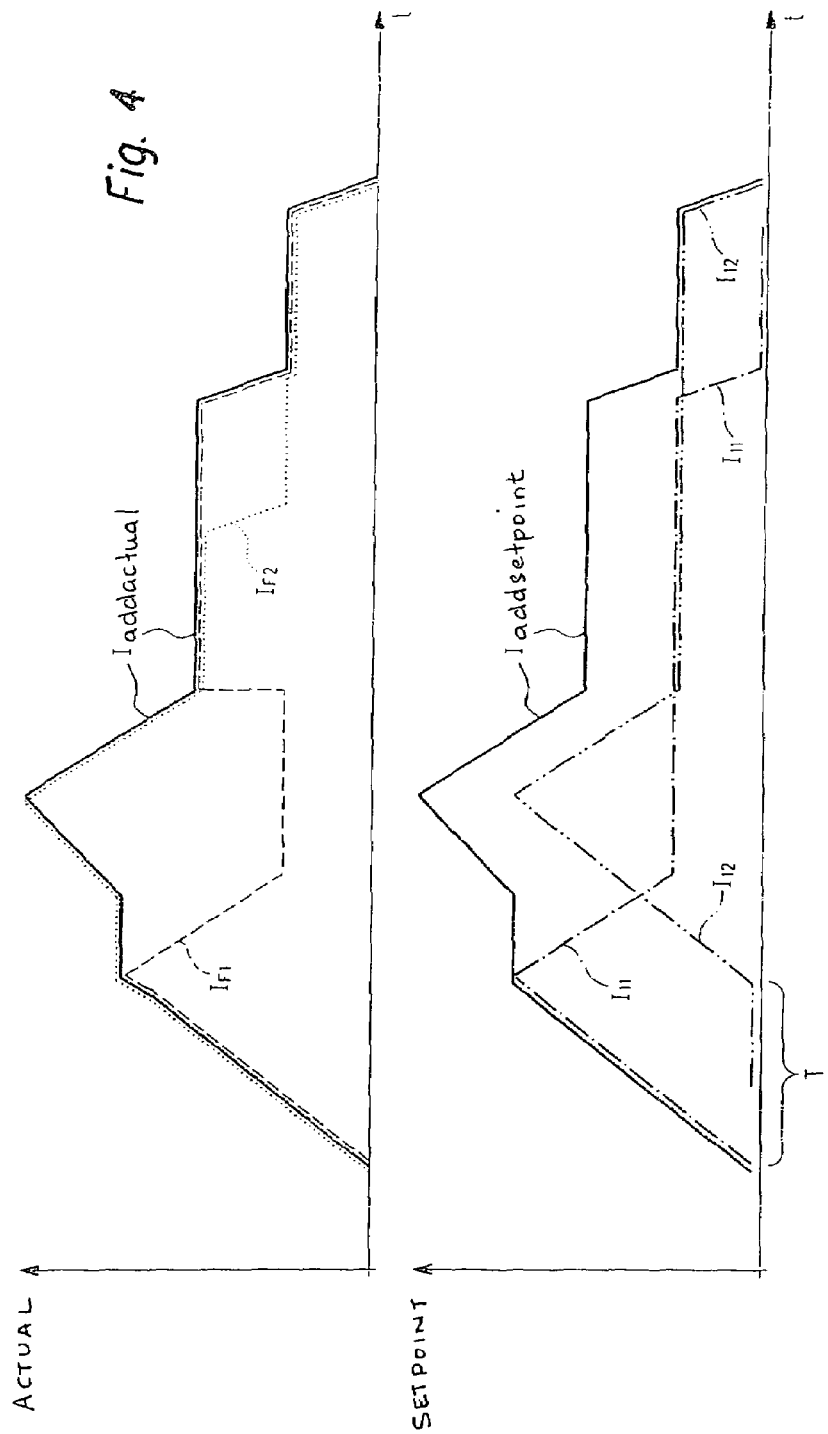
FIG. 4 shows two schematic time charts of currents over two electromagnetic valves of FIG. 1 in the four time ranges.

In FIG. 4 it is assumed that two valves 11, 12 each receive current $I_{MV}$ depicted in FIG. 3 in short intervals in succession. In the bottom time chart in FIG. 4, these two currents $I_{MV}$ are depicted as setpoint currents $I_{11}$, $I_{12}$. The time interval between these two setpoint currents $I_{11}$, $I_{12}$ is characterized as time period T.

Two setpoint currents $I_{11}$, $I_{12}$ result from the fact that switches S1, S2 of output stage 20 are triggered by control unit 19 in such a way that essentially setpoint currents $I_{11}$, $I_{12}$ mentioned above will have to flow across valves 11, 12. However, there is the possibility that because of some malfunction, setpoint currents $I_{11}$, $I_{12}$ might not actually flow or at least might be modified.

Such faults may be recognized by control unit 19 as follows:

As mentioned above, switches S1, S2 of output stage 20 are triggered by control unit 19, so control unit 19 may compute setpoint currents $I_{11}$, $I_{12}$ and in particular their plot over time. Control unit 19 may also add the calculated setpoint currents $I_{11}$, $I_{12}$. This yields total setpoint current $I_{addsetpoint}$ depicted in the bottom time chart in FIG. 4.

As already explained previously, control unit 19 also determines total actual current $I_{addactual}$. This total actual current $I_{addactual}$ is depicted in the top time chart in FIG. 4. In an additional step for control unit 19, total actual current $I_{addactual}$ may be compared with expected total setpoint current $I_{addsetpoint}$.

If this comparison does not reveal any deviation between two total currents, this means that there is no fault. Setpoint currents $I_{11}$, $I_{12}$ calculated by control unit 19 thus in fact flow across valves 11, 12. This fault-free case occurs when total actual current $I_{addactual}$ corresponds to the solid line according to the top time chart in FIG. 4.

However, if total actual current $I_{addactual}$ deviates from total setpoint current $I_{addsetpoint}$, this means that there is a fault in device 10 in FIG. 1. Two fault cases are described below as examples on the basis of the top time chart in FIG. 4.

If the total actual current has a curve like that shown with a dotted line for faulty total current $I_{F1}$ in the top time chart in FIG. 4, the comparison of this faulty total current $I_{F1}$ with total setpoint current $I_{addsetpoint}$ will show a deviation. From corresponding computations, control unit 19 may then determine that the deviation is based on a faulty current for valve 12. This results from the fact that setpoint current $I_{11}$ for valve 11 is completely contained in faulty total current $I_{F1}$, but there are no components of setpoint current $I_{12}$ for valve 12. According to the top time chart in FIG. 4, these components include the booster current and the following free-running state for valve 12.

If total actual current $I_{addactual}$ has a curve like that shown as an example as faulty total current $I_{F2}$ in the top time chart in FIG. 4, this in turn represents a deviation of total current $I_{F2}$ from total setpoint current $I_{addsetpoint}$. Control unit 19 thus again recognizes a fault in device 10 of FIG. 1.

On the basis of the time conditions of the deviation of the faulty total current, control unit 19 may not only recognize a fault as such but may also localize the fault more precisely. Control unit 19 is able to deduce on the basis of the curve of faulty total current $I_{F2}$ that the booster current and free-running state of both valves 11, 12 were correct. However, the deviation in faulty total current $I_{F2}$ occurs in the range of the holding currents for two valves 11, 12. Either the holding current for valve 11 or the holding current for valve 12 may have a dip that results in the deviation in faulty current $I_{F2}$. There is a greater probability that the holding current has been ended too soon for valve 11 and that this has resulted in the deviation in faulty total current $I_{F2}$ from expected total setpoint current $I_{addsetpoint}$.

Thus on the whole, control unit 19 adds the currents measured by measuring devices 17, 18 to yield a total actual current $I_{addactual}$. In addition, control unit 19 determines as a function of the triggering of switches S1, S2 of output stage 20 total setpoint current $I_{addsetpoint}$ that would have to be present on the basis of the aforementioned triggering of switches S1, S2. Control unit 19 then compares total actual current $I_{addactual}$ and total setpoint current $I_{addsetpoint}$. If there is no deviation between them, device 10 is functioning without fault. If there is a deviation, this means that there is a fault in device 10. Control unit 19 is able to localize the fault of device 10 more precisely, in particular to limit it to one of valves 11, 12, from the time conditions, in particular from the point in time of occurrence of a deviation in total actual current $I_{addactual}$ from total setpoint current $I_{addsetpoint}$.

Figure 5:
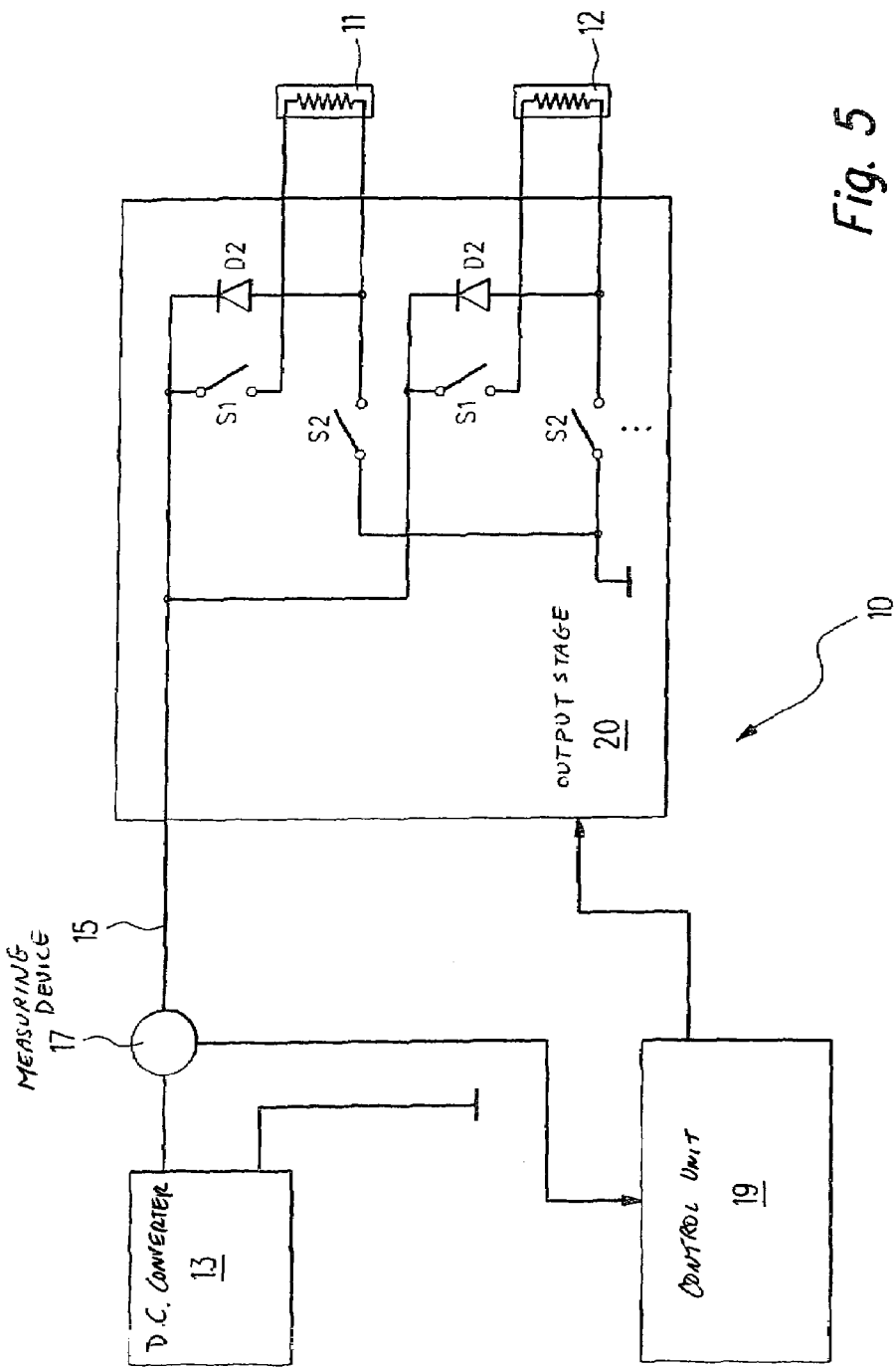
FIG. 5 shows a schematic block diagram of a second exemplary embodiment of a device according to the present invention for monitoring at least two electromagnetic valves of an internal combustion engine.

FIG. 5 corresponds largely to FIG. 1. For this reason, the same reference numerals also have the same meanings. The difference between FIG. 1 and FIG. 5 is that d.c. converter 14, measuring device 18, diodes D1 and corresponding electric line 16 are no longer present. Only single measuring device 17 remains and measures the current generated by single d.c. converter 13.

Remaining d.c. converter 13 is no longer provided for generating the booster current but instead is provided for generating the holding current. To do so, two switches S1, S2 are either closed simultaneously so that the holding current flows across both valves 11, 12 or switch S1 is closed and switch S2 is opened so that the holding current is quenched.

As in FIG. 4, it is also assumed in FIG. 6 that both valves 11, 12 receive a current one after the other in short intervals. This is depicted by two setpoint currents $I_{11}$, $I_{12}$ in the bottom time chart in FIG. 6, these currents being generated by the triggering of switches S1, S2 as mentioned above, and their time interval being again referred to as time period T. Addition of two setpoint currents $I_{11}$, $I_{12}$ yields total setpoint current $I_{addsetpoint}$ of FIG. 6.

A total actual current $I_{actual}$ is plotted in the top time chart in FIG. 6. In contrast with FIG. 4, where total actual current $I_{addactual}$ is obtained by adding two currents generated by two d.c. converters 13, 14 and flowing across two measuring devices 17, 18, total actual current $I_{actual}$ in FIG. 6 is generated directly by d.c. converter 13 and measured by a single measuring device 17. Thus there is no adding of the actual currents in FIG. 6 or in FIG. 4.

Total actual current $I_{actual}$ is compared with total setpoint current $I_{addsetpoint}$. If this comparison does not yield any deviations, this means that there is no fault. However, if there is a deviation, this indicates that there is a fault.

A faulty current $I_{F1}$, which does not match total setpoint current $I_{addsetpoint}$ of the lower time chart in FIG. 6, is indicated in the top time chart in FIG. 6. A fault may be deduced in conjunction with the current flowing across valve 12 on the basis of the curve of this faulty current $I_{F1}$ and its comparison with total setpoint current $I_{addsetpoint}$.

What is claimed is:

1. A method for monitoring at least two electromagnetic valves of an internal combustion engine, in which an actual current sent to each of the at least two valves is independent of other ones of the at least two valves and in which a setpoint current for each of the at least two valves is preselected, the method comprising:
    determining a total actual current that is supplied to the at least two valves;
    adding the setpoint currents to form a total setpoint current;
    comparing the total setpoint current to the total actual current and providing a comparison result; and
    monitoring at least one of an interconnection of the at least two valves and the at least two valves based on the comparison result,
    wherein a holding current, via which a corresponding one of the at least two valves is held in an end position in a stable manner, is used as the actual current.

2. The method of claim 1, wherein a quenching current, which results from electric energy remaining in at least one of the at least two valves after shutdown of the holding current, is used as the actual current.

3. A computer medium having a computer program executable on a computer arrangement, comprising:
    program code for monitoring at least two electromagnetic valves of an internal combustion engine, in which an actual current sent to each of the at least two valves is independent of other ones of the at least two valves and in which a setpoint current for each of the at least two valves is preselected, by performing the followings:
    determining a total actual current that is supplied to the at least two valves;
    adding the setpoint currents to form a total setpoint current;
    comparing the total setpoint current to the total actual current and providing a comparison result; and
    monitoring at least one of an interconnection of the at least two valves and the at least two valves based on the comparison result;
    wherein a holding current, via which a corresponding one of the at least two valves is held in an end position in a stable manner, is used as the actual current.

4. A device for monitoring at least two electromagnetic valves of an internal combustion engine, in which an actual current sent to each of the at least two valves is independent of other ones of the at least two valves and in which a setpoint current for each of the at least two valves is preselected, comprising:
    an arrangement, which includes a control arrangement, to determine a total actual current that is supplied to the at least two valves, add the setpoint currents to form a total setpoint current, compare the total setpoint current to the total actual current and providing a comparison result, and monitor at least one of an interconnection of the at least two valves and the at least two valves based on the comparison result, wherein a holding current, via which a corresponding one of the at least two valves is held in an end position in a stable manner, is used as the actual current.

5. The device of claim 4, wherein at least two measuring devices measure the actual currents supplied to the at least two valves, and the measured actual currents are added by the control arrangement to form the total actual current.

6. The device of claim 4, wherein a single measuring device measures the currents supplied to the at least two valves, and the measured actual currents are used by the control arrangement as the total actual current.

7. The device of claim 4, wherein d.c. converters generate the actual currents supplied to the at least two valves.

8. The device of claim 4, wherein an output stage controls the actual currents supplied to the at least two valves.

9. The device of claim 8, wherein the output stage includes switches which are switchable by the control arrangement.

* * * * *